United States Patent
Lumb

(10) Patent No.: US 9,436,723 B2
(45) Date of Patent: *Sep. 6, 2016

(54) SEGMENT DEDUPLICATION SYSTEM WITH COMPRESSION OF SEGMENTS

(71) Applicant: EMC Corporation, Hopkinton, MA (US)

(72) Inventor: Christopher R. Lumb, Mountain View, CA (US)

(73) Assignee: EMC Corporation, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/271,246

(22) Filed: May 6, 2014

(65) Prior Publication Data

US 2014/0330797 A1  Nov. 6, 2014

Related U.S. Application Data

(63) Continuation of application No. 12/455,951, filed on Jun. 9, 2009, now Pat. No. 8,762,348.

(51) Int. Cl.
*G06F 7/00* (2006.01)
*G06F 17/00* (2006.01)
(Continued)

(52) U.S. Cl.
CPC ....... *G06F 17/30371* (2013.01); *G06F 3/0608* (2013.01); *G06F 3/0641* (2013.01); *G06F 3/0683* (2013.01); *G06F 17/30067* (2013.01); *G06F 17/30286* (2013.01); *H03M 7/3064* (2013.01); *G06F 11/1435* (2013.01); *G06F 11/1453* (2013.01); *H03M 7/30* (2013.01)

(58) Field of Classification Search
CPC ............... G06F 17/3015; G06F 17/30153; G06F 17/30067; G06F 17/30286
USPC ................................. 707/674, 687
See application file for complete search history.

(56) References Cited

U.S. PATENT DOCUMENTS 6,438,468 B1  8/2002  Muxlow et al.
6,523,114 B1  2/2003  Barton
(Continued)

FOREIGN PATENT DOCUMENTS

| CN | 1758587 A | 4/2006 |
|---|---|---|
| CN | 101158954 A | 4/2008 |
| CN | 101409713 A | 4/2009 |

OTHER PUBLICATIONS

Khalid Sayood, "An Introduction to Data Compression". 2006.
(Continued)

*Primary Examiner* — James Trujillo
*Assistant Examiner* — Jessica N Le
(74) *Attorney, Agent, or Firm* — Van Pelt, Yi & James LLP

(57) ABSTRACT

A system for storing compressed data comprises a processor and a memory. The processor is configured to receive a compressed segment. The compressed segment is determined by breaking a data stream, a data block, or a data file into one or more segments and compressing each of the one or more segments. The processor is further configured to determine whether the compressed segment has been previously stored, and in the event that the compressed segment has not been previously stored, store the compressed segment. The memory is coupled to the processor and configured to provide the processor with instructions.

12 Claims, 13 Drawing Sheets

(51) Int. Cl.
*G06F 17/30* (2006.01)
*G06F 3/06* (2006.01)
*H03M 7/30* (2006.01)
*G06F 11/14* (2006.01)

(56) References Cited

U.S. PATENT DOCUMENTS

| | | | |
|---|---|---|---|
| 6,667,700 | B1 | 12/2003 | McCanne et al. |
| 7,143,251 | B1 * | 11/2006 | Patterson .......... G06F 17/30153 707/999.201 |
| 7,401,194 | B2 | 7/2008 | Jewell |
| 7,567,188 | B1 * | 7/2009 | Anglin ................ G06F 3/0608 341/63 |
| 7,584,338 | B1 | 9/2009 | Bricker et al. |
| 8,117,464 | B1 | 2/2012 | Kogelnik |
| 8,379,841 | B2 | 2/2013 | Taylor et al. |
| 2004/0199669 | A1 | 10/2004 | Dale et al. |
| 2005/0131939 | A1 * | 6/2005 | Douglis et al. ............ 707/103 Y |
| 2005/0131990 | A1 | 6/2005 | Jewell |
| 2005/0278525 | A1 | 12/2005 | Douceur et al. |
| 2007/0208893 | A1 * | 9/2007 | Azzarello et al. ............... 710/68 |
| 2007/0239946 | A1 * | 10/2007 | Zhu ................................ 711/154 |
| 2008/0098083 | A1 | 4/2008 | Shergill et al. |
| 2008/0243953 | A1 * | 10/2008 | Wu et al. ....................... 707/204 |
| 2008/0256143 | A1 * | 10/2008 | Reddy ............... G06F 17/30312 |
| 2009/0012990 | A1 * | 1/2009 | Lariba-Pey et al. .......... 707/102 |
| 2009/0234870 | A1 * | 9/2009 | Bates et al. .................... 707/101 |
| 2009/0268903 | A1 | 10/2009 | Bojinov et al. |
| 2010/0011031 | A1 * | 1/2010 | Huang et al. ................. 707/202 |
| 2010/0198797 | A1 | 8/2010 | Wideman |
| 2010/0228800 | A1 * | 9/2010 | Aston et al. ................... 707/822 |
| 2010/0332818 | A1 * | 12/2010 | Prahlad et al. ................ 713/150 |
| 2011/0194688 | A1 | 8/2011 | Le Barz et al. |

OTHER PUBLICATIONS

Sayood, Khalid, "Introduction to Data Compression", 2006.

* cited by examiner

SEGMENT DEDUPLICATION SYSTEM WITH COMPRESSION OF SEGMENTS

CROSS REFERENCE TO OTHER APPLICATIONS

This application is a continuation of co-pending U.S. patent application Ser. No. 12/455,951 entitled SEGMENT DEDUPLICATION SYSTEM WITH COMPRESSION OF SEGMENTS filed Jun. 9, 2009 which is incorporated herein by reference for all purposes.

BACKGROUND OF THE INVENTION

Segment data duplication storage system store data in a space efficient manner by only storing a newly received segment in the event that an identical segment to the newly received segment has not been previously stored. However, some user of storage systems would like the ability to encrypt data prior to storing in order to ensure security. Encryption, however, typically does not allow an identical segment to be identified and thereby eliminating the efficiency of the deduplication system. Also, some deduplication systems would like to use a compression for the data that is requested to be stored. However, compression typically does not allow an identical segment to be identified and thereby eliminating the efficiency of the deduplication system.

BRIEF DESCRIPTION OF THE DRAWINGS

Various embodiments of the invention are disclosed in the following detailed description and the accompanying drawings.

DETAILED DESCRIPTION

Figure 1:
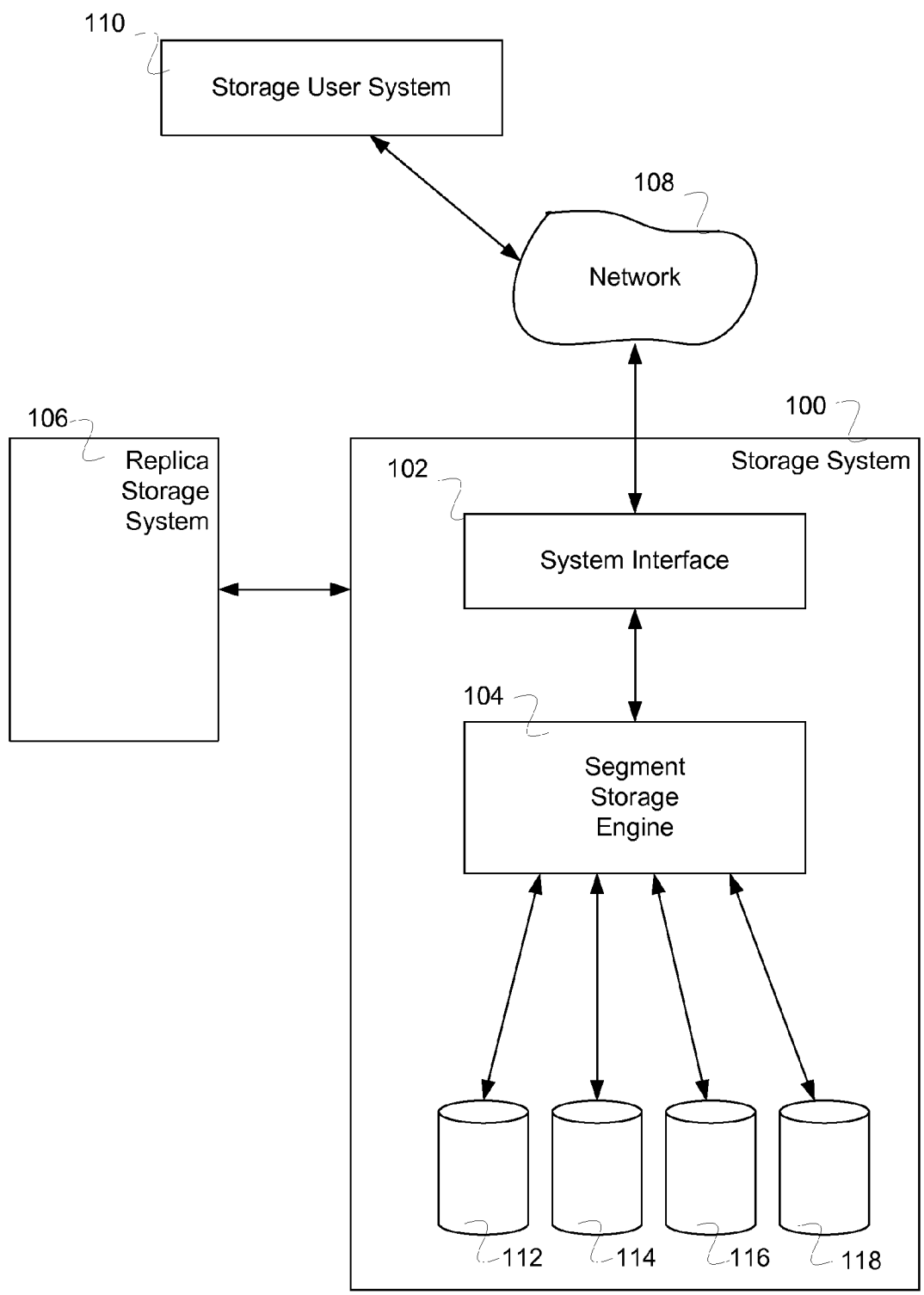
FIG. 1 is a block diagram illustrating an embodiment of a system for storage for data.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A segment deduplication system with compression of segments is disclosed. The system comprises a processor and a memory. The processor is configured to receive and compress segments and determine whether a compressed segment has been previously stored. The compressed segment is determined by breaking a data stream, a data block, or a data file into one or more segments and compressing each of the one or more segments. In the event that the compressed segment has not been previously stored, the compressed segment is stored.

A system for reading compressed data is disclosed. The system comprises a deduplicated storage device and a processor. The processor is configured to retrieve one or more compressed segments from the deduplicated storage device. The one or more compressed segments were determined by breaking a data stream, a data block, or a data file into one or more segments and compressing each of the one or more segments. The processor is further configured to decompress the segments and assemble the segments to reconstruct the data stream, the data block, or the data file.

In some embodiments, a segment deduplication system with encryption of segments is disclosed. The system comprises a processor and a memory. The processor is configured to receive and encrypted segment and determine whether the encrypted segment has been previously stored. The encrypted segment is determined by breaking a data stream, a data block, or a data file into one or more segments and encrypting each of the one or more segments. In the event that the encrypted segment has not been previously stored, the encrypted segment is stored.

In some embodiments, a system for reading encrypted data is disclosed. The system comprises a deduplicated storage device and a processor. The processor is configured to retrieve one or more encrypted segments from the deduplicated storage device. The one or more encrypted segments were determined by breaking a data stream, a data block, or a data file into one or more segments and encrypting each of the one or more segments. The processor is further configured to decrypt the segments and assemble the segments to reconstruct the data stream, the data block, or the data file.

In some embodiments, a system for storing encrypted and compressed data is disclosed. The system comprises a processor configured to determine whether an encrypted compressed segment has been previously stored. The encrypted compressed segment was determined by breaking a data stream, a data block, or a data file into one or more segments and compressing and then encrypting each of the one or more segments. In the event that the encrypted compressed segment has not been previously stored, the encrypted compressed segment is stored.

In some embodiments, a system for reading encrypted compressed data. The system comprises a deduplicated storage device and a processor. The processor is configured to decrypt one or more encrypted compressed segments stored in the deduplicated storage device. The one or more encrypted compressed segments were determined by breaking a data stream, a data block, or a data file into one or more segments and compressing and then encrypting each of the one or more segments. The processor is further configured to decompress the one or more decrypted compressed segments and assemble the one or more decrypted decompressed segments to reconstruct the data stream, the data block, or the data file.

In some embodiments, encryption of segment(s) provides security for data content of the segment(s) during transmission between systems and during storage while still providing efficient deduplication storage of segment(s). In some embodiments, compression of segment(s) provides bandwidth savings during transmission between systems and storage space savings during storage while still providing efficient deduplication storage of segment(s).

FIG. 1 is a block diagram illustrating an embodiment of a system for storage for data. In the example shown, storage system 100 is accessed by a user using storage user system 110 or by storage user system 110 via network 108. In various embodiments, network 108 comprises one or more of a wired network, a wireless network, a local area network, a wide area network, the Internet, or any other appropriate network. Storage system 100 comprises system interface 102, segment storage engine 104, and a plurality of storage units (represented in FIG. 1 by storage unit 112, storage unit 114, storage unit 116, and storage unit 118). Storage system 100 is replicated using replica storage system 106. For example, a storage unit is replicated by storing segments and metadata stored on the storage unit to another storage unit.

Storage user system 110 breaks a file, a data stream, or a data block into segment(s) (e.g., boundaries are identified for one or more segments—for example, a hash function operates on a portion of the content of the file; when the hash function is equal to a value, is a minimum value, is a maximum value, is between a minimum and maximum length, and/or is an extrema value within a window of the file, etc. a segment boundary is determined). Segment boundaries are determined such that two similar files, data streams, or data blocks have the goal of having the same segments for identical portions of the files, data streams, or data blocks, and different segments for the non-identical portions of the files, data streams, or data blocks. In various embodiments, the segment determination is based on the content of the data (e.g., using value(s) calculated based on data content), not based on the content (e.g., byte count, file criteria, etc.), or a combination of content based criteria and non-content based criteria. In various embodiments, storage user system 110 encrypts and/or compresses the segments. Storage user system 110 sends the segment(s) (e.g., compressed segments, encrypted segments, compressed encrypted segments, etc.) to be stored by storage system 100 via network 108. In various embodiments, information regarding how to reconstruct the file, the data stream, or the data block is also sent from storage user system 110 to storage system 100 and/or is stored by storage user system 110, or any other appropriate action for the information.

Storage system 100 receives the segment using system interface 102. Segment storage engine 104 stores the segments in a storage unit (e.g., storage unit 112, storage unit 114, storage unit 116, or storage unit 118). In various embodiments, a storage unit comprises a storage device, multiple storage devices, a portion of a storage device, a hard drive, an array of drives, a semiconductor memory, or any other appropriate storage unit. Segment storage engine 104 only stores a segment in a storage unit if the segment has not been previously stored in the storage unit. In some embodiments, an identifier (e.g., a digital fingerprint, Secure Hash Algorithm hash value, a Rabin hash, etc.) is used for determining whether a segment has been previously stored by seeing if an identical identifier already exists in an index of stored segments for storage system 100. In various embodiments, the identifier for a given segment is determined using storage system 100, using storage user system 110, or any other appropriate system. In some embodiments, an identifier is sent along with an associated segment from storage user system 110 to storage system 100.

Storage user system 110 requests one or more segments that is/are stored on storage system 100 via network 108. Storage system 100 receives the request using system interface 102. Segment storage engine 104 finds the segments used to store a file, data stream, or data block in the appropriate storage unit(s). The one or more segments are sent to storage user system 110 via network 108. Storage user system 110 uses the one or more segments to reconstruct a file, data stream, or data block. In various embodiments, the segment(s) are decrypted and/or decompressed or any other appropriate processing in order to reconstruct the desired file, data stream, or data block.

In various embodiments, encryption, decryption, compression, and/or decompression systems used are any appropriate systems that are compatible with a data segment deduplication system—for example, a system where a given encrypted and/or compressed segment can be used to identify whether an identical segment that has also been similarly encrypted and/or compressed has been previously stored.

In various embodiments, hardware and/or software components or accelerators or one or more processors are used for compression, decompression, encryption, and/or decryption, or any other appropriate combination of hardware and/or software.

In some embodiments, storage user system 110 is one of a plurality of storage user systems and each of the plurality can use different or similar compression/decompression and/or encryption systems, and/or different keys for similar encryption systems.

Figure 2:
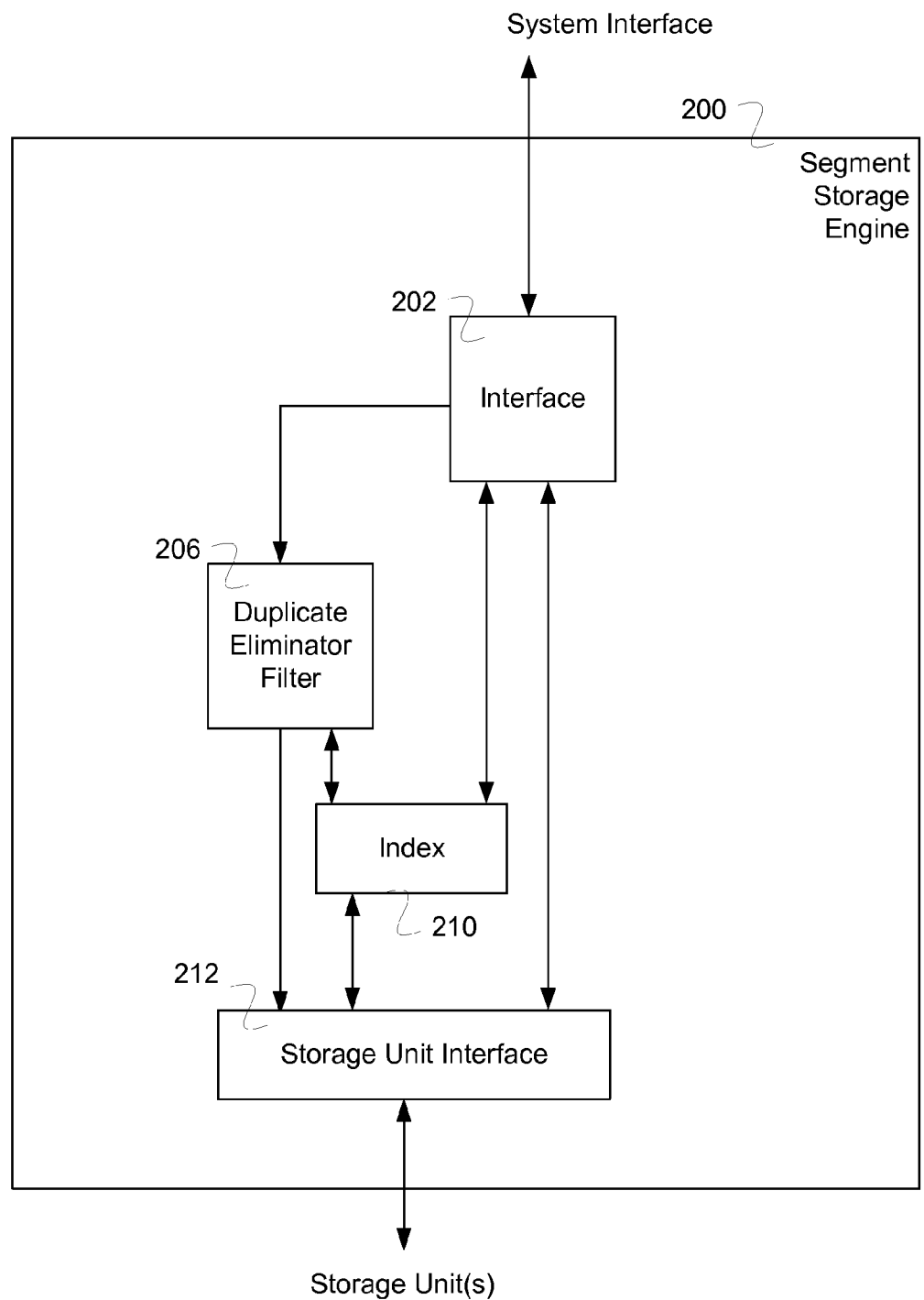
FIG. 2 is a block diagram illustrating an embodiment of a segment storage engine.

FIG. 2 is a block diagram illustrating an embodiment of a segment storage engine. In some embodiments, the system of FIG. 2 is used to implement segment storage engine 104 of FIG. 1. In the example shown, segment storage engine 200 comprises interface 202, duplicate eliminator filter 206, index 210, and segment storage unit interface 212. Segment storage engine 200 receives segment(s) using interface 202. Duplicate eliminator 206 identifies whether a newly received segment has already been stored in segment storage unit(s). Index 210 is used to locate stored segments in storage unit(s) using storage unit interface 212.

Interface 202 receives a request to retrieve segment(s). Interface 202 communicates with index 210 to locate appropriate segments stored in storage units via storage unit interface 212. Appropriate segment(s) is/are provided via interface 202 in response to the request. In some embodiments, metadata information is stored associated with a segment—for example, segment identifier, source system, session information, user information, host information, key information, encryption type, compression information, compression type, format information, pad information, associated file, data stream, or data block, etc.

Figure 3:
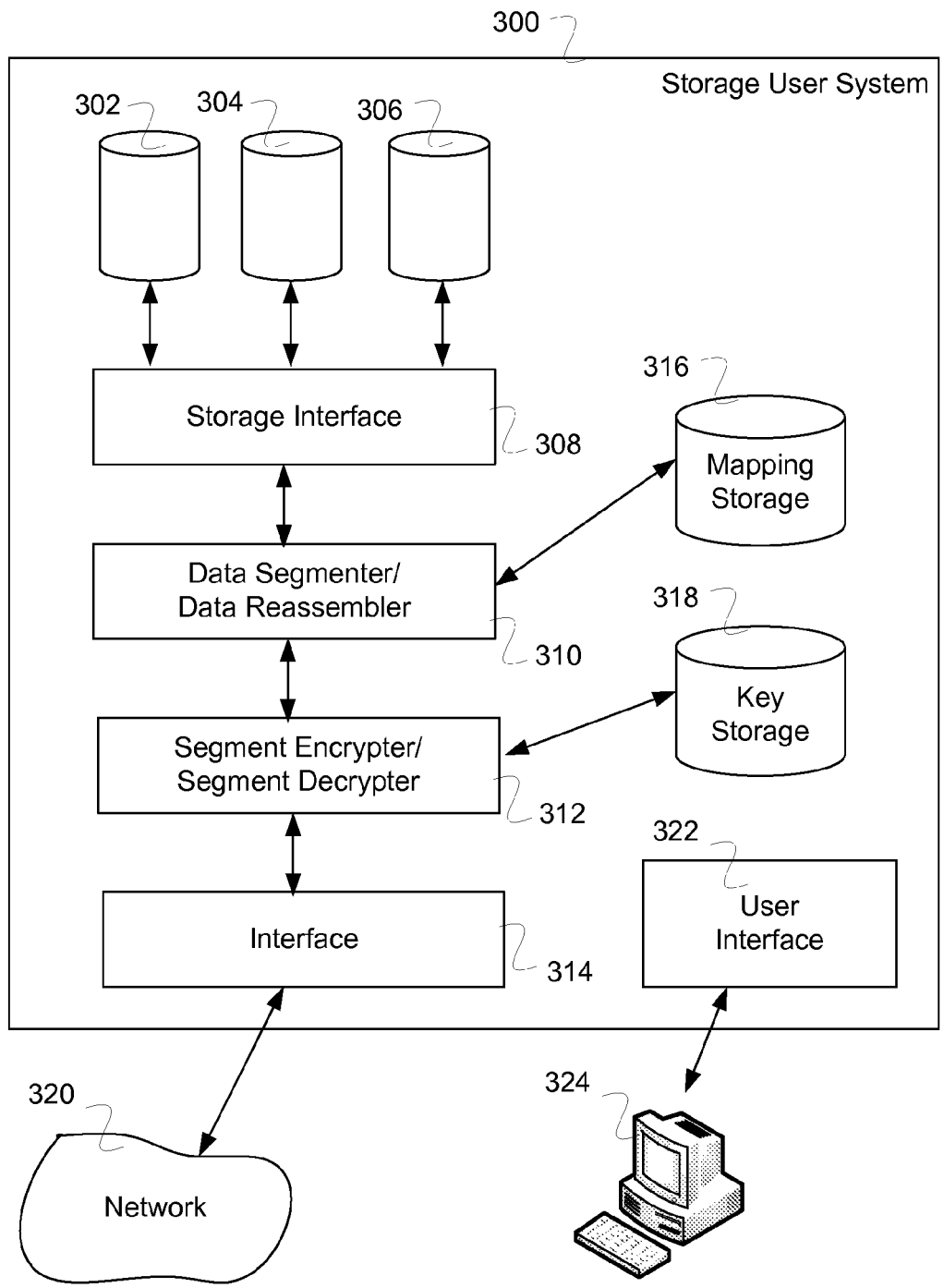
FIG. 3 is a block diagram illustrating an embodiment of a storage user system.

FIG. 3 is a block diagram illustrating an embodiment of a storage user system. In some embodiments, storage user system 300 of FIG. 3 is used to implement storage user system 110 of FIG. 1. In the example shown, storage user system 300 comprises storage device 302, storage device 304, storage device 306, storage interface 308, data segmenter/data reassembler 310, segment encrypter/segment decrypter 312, interface 314 which is coupled to network 320, mapping storage 316, key storage 318, and user interface 322 which is able to be accessed by user 324. User 324 is able to request via user interface 322 that a file, data stream, or data block is to be stored. Storage interface 308 receives a file, data stream, or data block to be processed from storage device 302, storage device 304, or storage device 306. In various embodiments, storage interface 308 receives a file, data stream, or data block from an external storage device (not shown in FIG. 3), an external system (not shown in FIG. 3), or any other appropriate internal or external component, device, or system.

The file, data stream, or data block is processed by data segmenter/data reassembler 310. Data segmenter/data reassembler 310 breaks the file, data stream, or data block into segments. In various embodiments, the file, data stream, or data block is broken into segments by identifying segment boundaries using a content-based technique (e.g., a function is calculated at various locations of a data item, when the function is equal to a value or when the value is a minimum, a maximum, or other extrema value relative to other function values calculated for the data item), a non-content-based technique (e.g., based on data item property—for example, byte length, title, creation date), or any other appropriate technique. In various embodiments, a segment is restricted to a minimum and/or maximum length, to a minimum or maximum number of segments per data item, or any other appropriate limitation. Data segmenter/data reassembler 310 further processes information to indicate the segment(s) mapping to the file, data stream, or data block so that the file, data stream, or data block can be reconstructed from the segment(s). In some embodiments, a list of fingerprints is used to indicate a mapping of segment(s) that are associated with a file, data stream, or data block. Mapping information is stored using mapping storage 316.

Segment encrypter/segment decrypter 312 encrypts the segment(s). The encryption and decryption system is compatible with being able to store the segment(s) using a deduplication system—for example, there is a one to one correspondence between a given segment and the encrypted version of the given segment so that it can be identified by using the encrypted version of the given segment whether the given segment in its encrypted form has been previously stored. Note that this somewhat degrades the strength of possible encryption systems that can be used, however the overall system performance of having an encrypted deduplication system outweighs for some applications the selection of encryption system with the required properties. In various embodiments, encryption system and/or decryption system comprise(s) a stream cipher (e.g., Rivest Cipher 4 (RC4), Rivest Cipher 5 (RC5), etc.), a cipher feedback system, electronic code book system, advanced encryption standard (AES), data encryption standard (DES), or any other appropriate system. In some embodiments, a fixed block cipher system is used by padding a segment to a fixed block size before encrypting or depadding after decrypting.

The encrypted segment is transferred to a system coupled to storage user system 300 via interface 314 and network 320.

User 324 is able to request via user interface 322 that a file, data stream, or data block is to be retrieved. Information stored in mapping storage 316 is used by data segmenter/data reassembler 310 to determine which encrypted segment(s) to request to be retrieved from a deduplicating segment storage system (e.g., storage system 100 of FIG. 1). The encrypted segment(s) are transferred via network 320 and interface 314 and decrypted using segment encrypter/segment decrypter 312. Segmenter encrypter/segment decrypter 312 uses information stored in key storage 318 to decrypt encrypted segment(s). In various embodiments, keys stored in key storage 318 are associated with segments based at least in part on one or more of the following: a user, a source system, a session, or any other appropriate manner of assigning keys associated with a file, data stream, or data block. Data segmenter/data reassemble 310 reassembles the decrypted segment(s) to restore the file, data stream, or data block.

Figure 4:
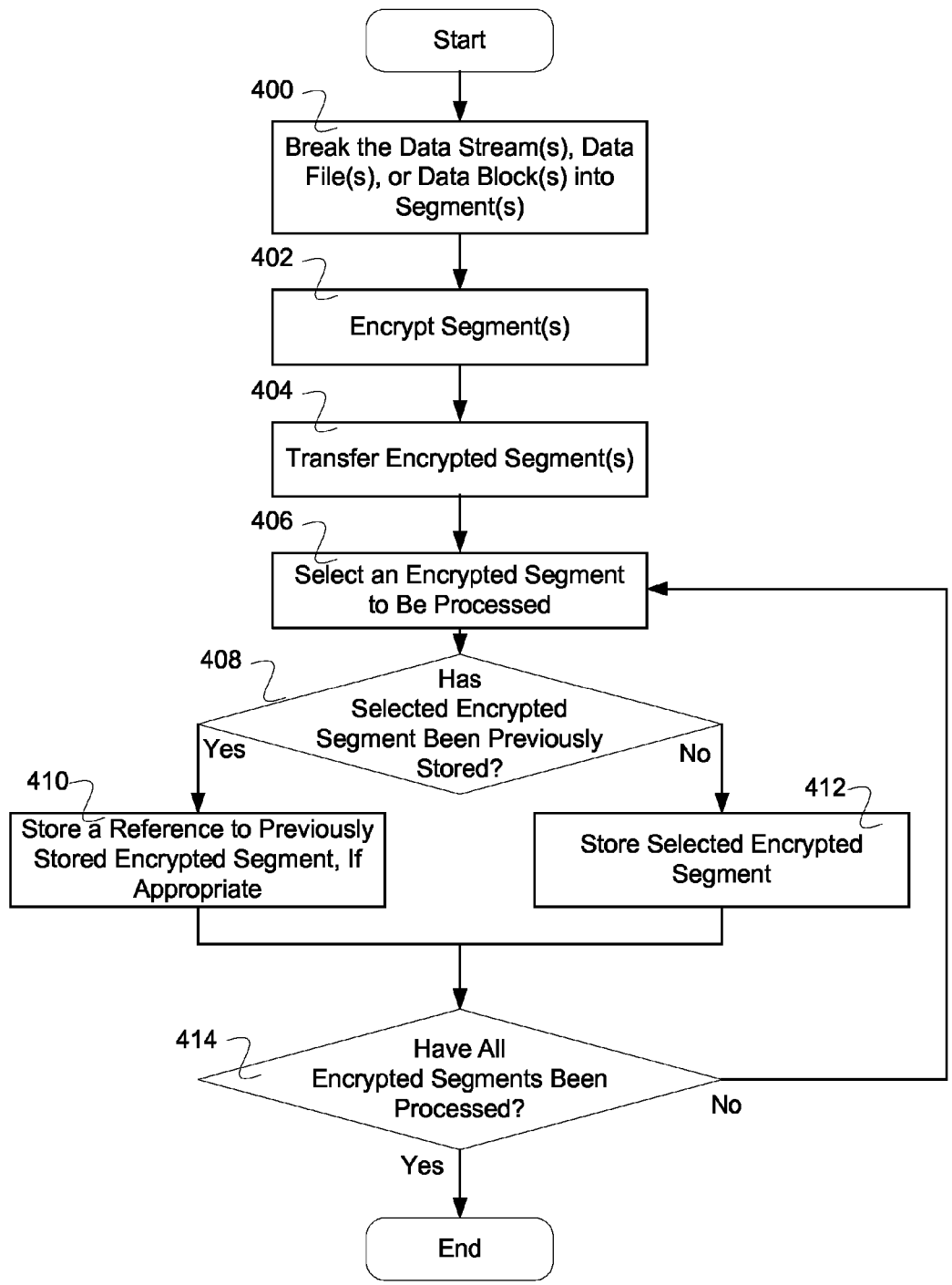
FIG. 4 is a flow diagram illustrating an embodiment of a process for storing data.

FIG. 4 is a flow diagram illustrating an embodiment of a process for storing data. In the example shown, in 400 the data stream(s), data file(s), or data block(s) is/are broken into segment(s). In 402, segment(s) are encrypted. In 404, encrypted segment(s) is/are transferred. For example, the encrypted segment(s) is/are transferred from a data user system to a storage system. In various embodiments, metadata information is transferred associated with the encrypted segment(s)—for example, a segment identifier, a source identifier, a user identifier, a host identifier, a session identifier, an encryption type, an encryption key, a format type, a pad type, an associated file, data stream, or data block, etc. In 406, an encrypted segment is selected to be processed. In 408, it is determined whether the selected encrypted segment has been previously stored.

In some embodiments, a check is performed before transferring the encrypted segment to determine whether the encrypted segment has been previously stored and transfer of the full segment is only performed in the event that the encrypted segment has not been previously stored.

In the event that the segment has been previously stored, in 410 a reference is stored to the previously stored encrypted segment, if appropriate. For example, a reference is stored in the event that the reference is useful in being able to retrieve the encrypted segment with respect to retrieving the data stream(s), data block(s), or file(s) associated with the segment that has been encrypted and is determined to be identical to a previously stored encrypted segment. In some embodiments, the reference is stored in an index that associates a mapping between data stream(s), data block(s), or file(s) and the segment(s) determined from the data stream(s), data block(s), or file(s). In some embodiments, a reference or indication is transferred to a user storage system.

In the event that the segment has not been previously stored, in 412 the selected encrypted segment is stored. An index entry is stored indicating the location at which the selected encrypted segment is stored. In various embodiments, the index entry comprises digital fingerprint, a SHA-1 hash, Rabin Hash or any other appropriate identifier that is used to identify whether an identical segment has been previously stored. In some embodiments, the index entry is transferred to a user storage system.

In 414, it is determined whether the all encrypted segments have been processed. In the event that all the encrypted segments have not all been processed, control passes to 406. In the event that all the encrypted segments have all been processed, the process ends.

Figure 5:
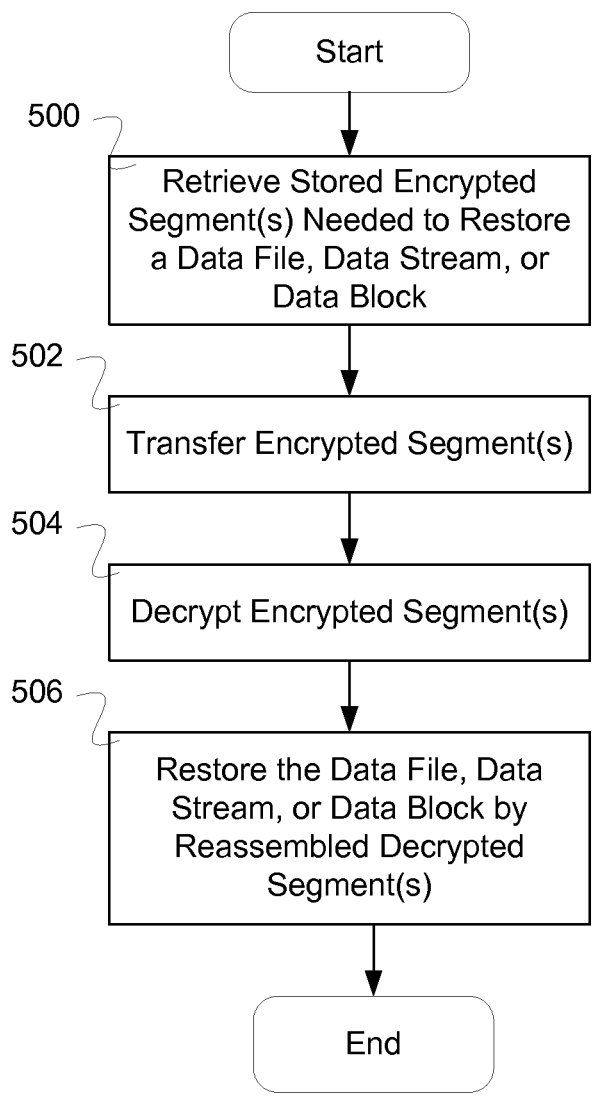
FIG. 5 is a flow diagram illustrating a process for retrieving data.

FIG. 5 is a flow diagram illustrating a process for retrieving data. In the example shown, in 500 the stored encrypted segment(s) needed to restore a data file, data stream, or data block are retrieved. In 502, the encrypted segment(s) are transferred. For example, the retrieved segment(s) are sent from a storage system to a storage user system. In 504, the encrypted segment(s) are decrypted. In 506, the data file, data stream, or data block is restored by reassembling the decrypted segment(s).

Figure 6:
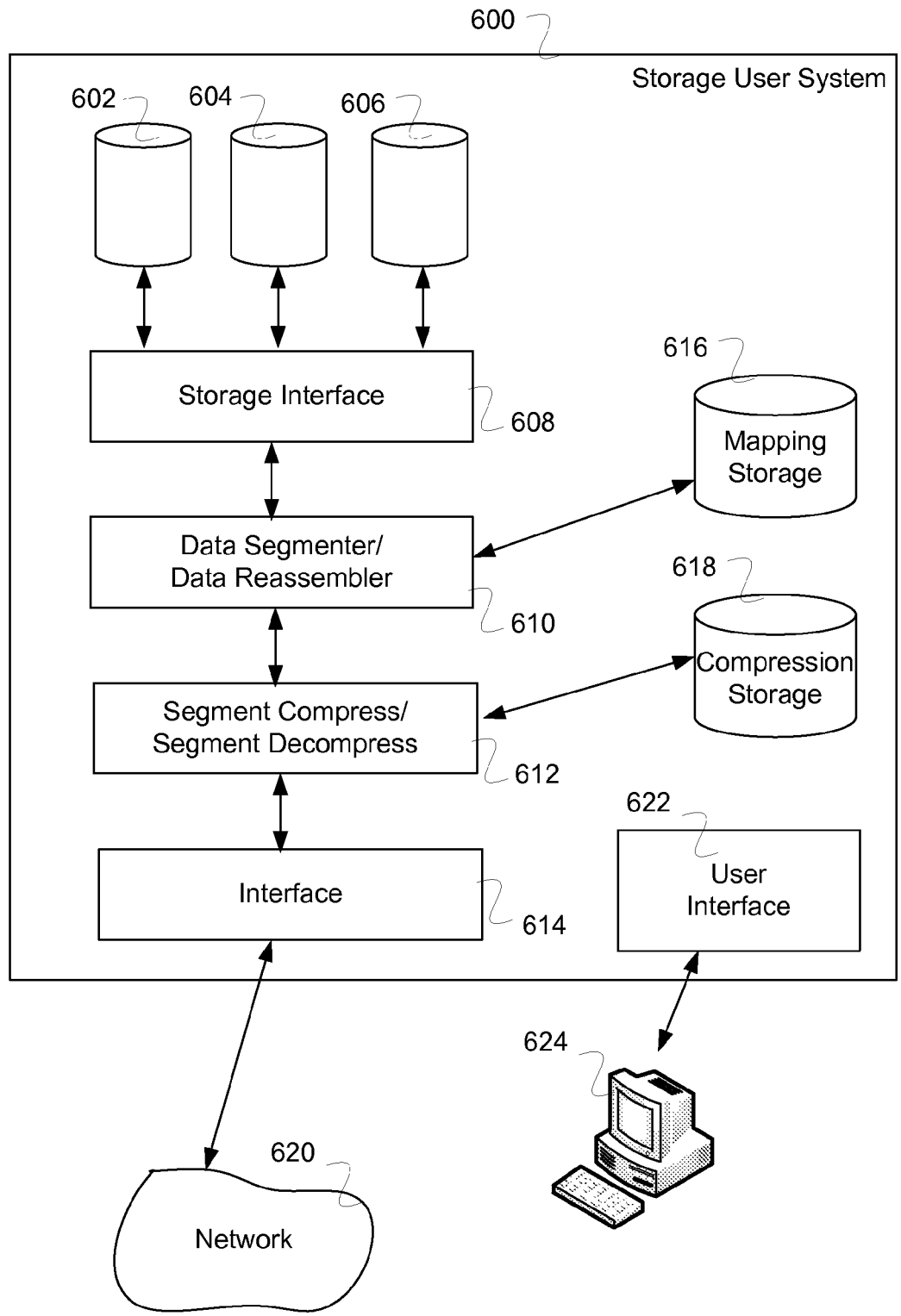
FIG. 6 is a block diagram illustrating an embodiment of a storage user system.

FIG. 6 is a block diagram illustrating an embodiment of a storage user system. In some embodiments, storage user system 600 of FIG. 6 is used to implement storage user system 110 of FIG. 1. In the example shown, storage user system 600 comprises storage device 602, storage device 604, storage device 606, storage interface 608, data segmenter/data reassemble 610, segment compress/segment decompress 612, interface 614 which is coupled to network 620, mapping storage 616, compression storage 618, and user interface 622 which is able to be accessed by user 624. User 624 is able to request via user interface 622 that a file, data stream, or data block is to be stored. Storage interface 608 receives a file, data stream, or data block to be processed from storage device 602, storage device 604, or storage device 606. In various embodiments, storage interface 608 receives a file, data stream, or data block from an external storage device (not shown in FIG. 6), an external system (not shown in FIG. 6), or any other appropriate internal or external component, device, or system.

The file, data stream, or data block is processed by data segmenter/data reassembler 610. Data segmenter/data reassembler 610 breaks the file, data stream, or data block into segments. In various embodiments, the file, data stream, or data block is broken into segments by identifying segment boundaries using a content-based technique (e.g., a function is calculated at various locations of a data item, when the function is equal to a value or when the value is a minimum, a maximum, or other extrema value relative to other function values calculated for the data item), a non-content-based technique (e.g., based on data item property—for example, byte length, title, creation date), or any other appropriate technique. In various embodiments, a segment is restricted to a minimum and/or maximum length, to a minimum or maximum number of segments per data item, or any other appropriate limitation. Data segmenter/data reassembler 610 further processes information to indicate the segment(s) mapping to the file, data stream, or data block so that the file, data stream, or data block can be reconstructed from the segment(s). In some embodiments, a list of fingerprints is used to indicate a mapping of segment(s) that are associated with a file, data stream, or data block. Mapping information is stored using mapping storage 616.

Segment compress/segment decompress 612 compresses the segment(s). The compression and decompression system is compatible with being able to store the segment(s) using a deduplication system—for example, there is a one to one correspondence between a given segment and the compressed version of the given segment so that it can be identified by using the compressed version of the given segment whether the given segment in its compressed form has been previously stored. In various embodiments, compression system and/or decompression system comprise(s) a lossless compression/decompression system, a Huffman coding system, a Lempel-Ziv Welch coding system, or any other appropriate system.

The compressed segment is transferred to a system coupled to storage user system 600 via interface 614 and network 620.

User 624 is able to request via user interface 622 that a file, data stream, or data block is to be retrieved. Information stored in mapping storage 616 is used by data segmenter/data reassembler 610 to determine which compressed segment(s) to request to be retrieved from a deduplicating segment storage system (e.g., storage system 100 of FIG. 1). The compressed segment(s) are transferred via network 620 and interface 614 and decompressed using segment compress/segment decompress 612. Segment compress/segment decompress 612 uses information stored in compression storage 618 to decompress compressed segment(s). In various embodiments, compression information stored in compression storage 618 are associated with segments based at least in part on one or more of the following: a user, a source system, a session, or any other appropriate manner of assigning compression information associated with a file, data stream, or data block. Data segmenter/data reassemble 310 reassembles the decompressed segment(s) to restore the file, data stream, or data block.

Figure 7:
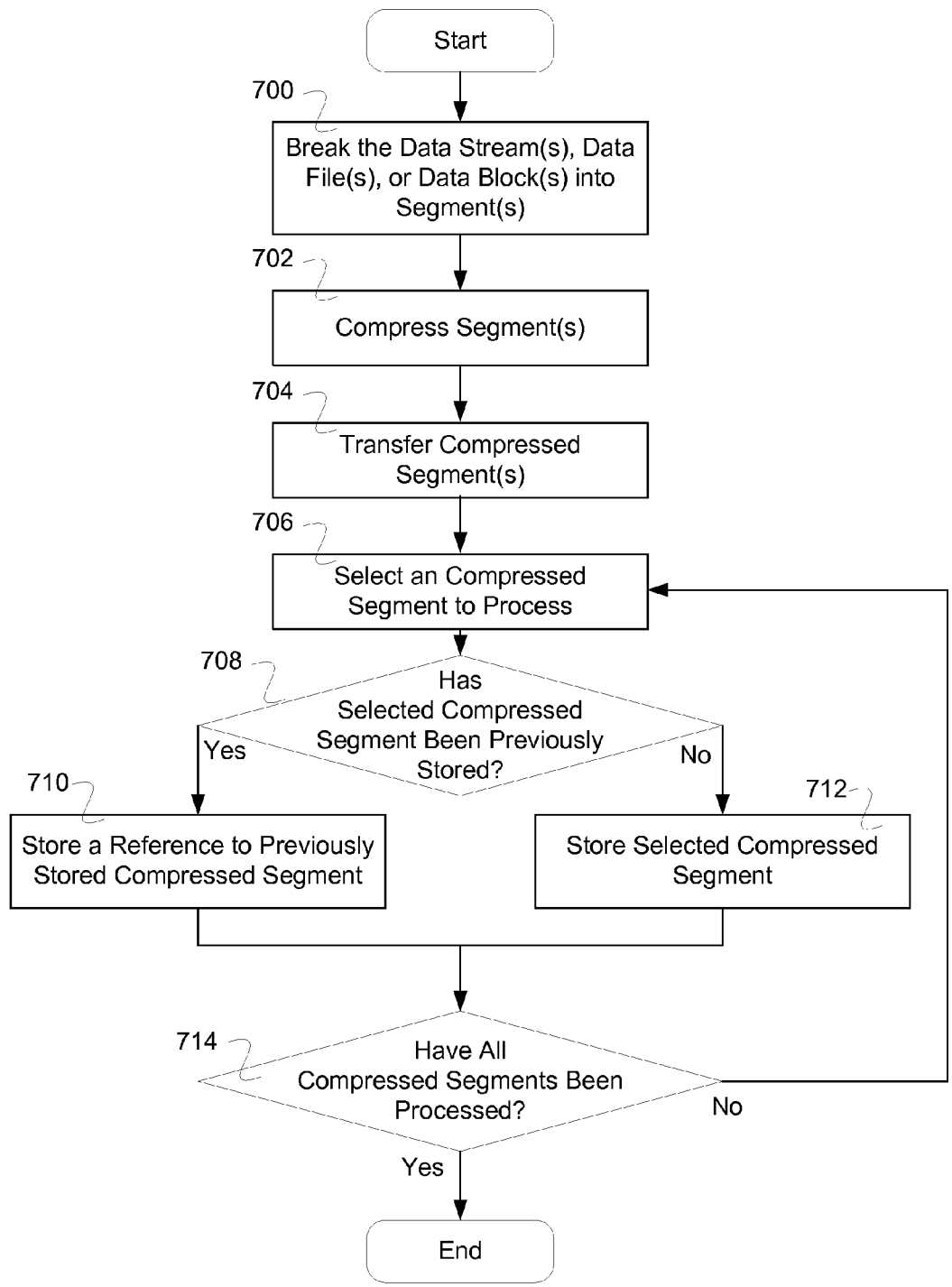
FIG. 7 is a flow diagram illustrating an embodiment of a process for storing data.

FIG. 7 is a flow diagram illustrating an embodiment of a process for storing data. In the example shown, in 700 the data stream(s), data file(s), or data block(s) is/are broken into segment(s). In 702, segment(s) are compressed. In 704, compressed segment(s) is/are transferred. For example, the compressed segment(s) is/are transferred from a data user system to a storage system. In various embodiments, metadata information is transferred associated with the compressed segment(s)—for example, a segment identifier, a source identifier, a user identifier, a host identifier, a session identifier, an compression type, a compressor state, a format type, an associated file, data stream, or data block, etc. In 606, a compressed segment is selected to be processed. In 608, it is determined whether the selected compressed segment has been previously stored.

In some embodiments, a check is performed before transferring the compressed segment to determine whether the compressed segment has been previously stored and transfer of the full segment is only performed in the event that the compressed segment has not been previously stored.

In the event that the segment has been previously stored, in 710 a reference is stored to the previously stored compressed segment, if appropriate. For example, a reference is stored in the event that the reference is useful in being able to retrieve the compressed segment with respect to retrieving the data stream(s), data block(s), or file(s) associated with the segment that has been compressed and is determined to be identical to a previously stored compressed segment. In some embodiments, the reference is stored in an index that associates a mapping between data stream(s), data block(s), or file(s) and the segment(s) determined from the data stream(s), data block(s), or file(s). In some embodiments, a reference or indication is transferred to a user storage system.

In the event that the segment has not been previously stored, in 712 the selected compressed segment is stored. An index entry is stored indicating the location at which the selected compressed segment is stored. In various embodiments, the index entry comprises digital fingerprint, a SHA-1 hash, Rabin Hash or any other appropriate identifier that is used to identify whether an identical segment has been previously stored. In some embodiments, the index entry is transferred to a user storage system.

In 714, it is determined whether the all compressed segments have been processed. In the event that all the compressed segments have not all been processed, control passes to 706. In the event that all the compressed segments have all been processed, the process ends.

Figure 8:
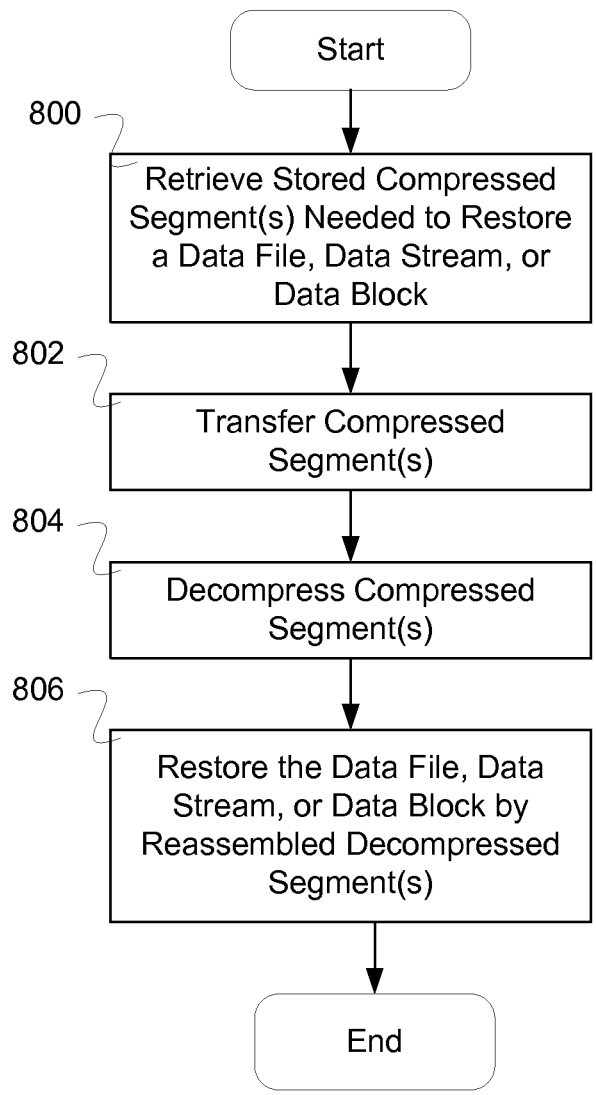
FIG. 8 is a flow diagram illustrating a process for retrieving data.

FIG. 8 is a flow diagram illustrating a process for retrieving data. In the example shown, in 800 the stored compressed segment(s) needed to restore a data file, data stream, or data block are retrieved. In 802, the compressed segment(s) are transferred. For example, the retrieved segment(s) are sent from a storage system to a storage user system. In 804, the compressed segment(s) are decompressed. In 806, the data file, data stream, or data block is restored by reassembling the decompressed segment(s).

Figure 9:
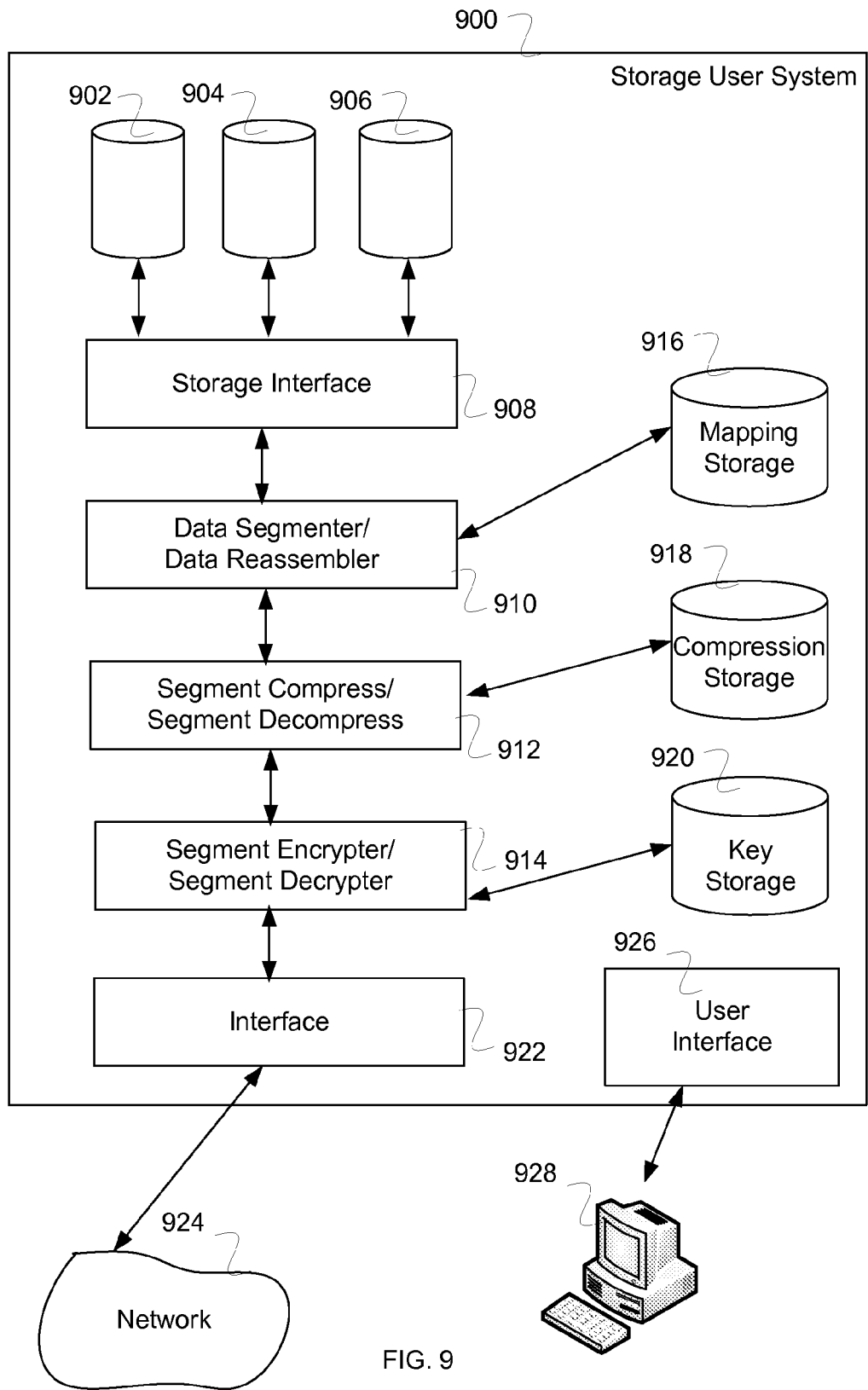
FIG. 9 is a block diagram illustrating an embodiment of a storage user system.

FIG. 9 is a block diagram illustrating an embodiment of a storage user system. In some embodiments, storage user system 900 of FIG. 9 is used to implement storage user system 110 of FIG. 1. In the example shown, storage user system 900 comprises storage device 902, storage device 904, storage device 906, storage interface 908, data segmenter/data reassembler 910, segment compress/segment decompress 912, segment encrypter/segment decryter 914, interface 922 which is coupled to network 924, mapping storage 916, compression storage 918, key storage 920, and user interface 926 which is able to be accessed by user 928. User 928 is able to request via user interface 926 that a file, data stream, or data block is to be stored. Storage interface 908 receives a file, data stream, or data block to be processed from storage device 902, storage device 904, or storage device 906. In various embodiments, storage interface 908 receives a file, data stream, or data block from an external storage device (not shown in FIG. 3), an external system (not shown in FIG. 3), or any other appropriate internal or external component, device, or system.

The file, data stream, or data block is processed by data segmenter/data reassembler 910. Data segmenter/data reassembler 910 breaks the file, data stream, or data block into segments. In various embodiments, the file, data stream, or data block is broken into segments by identifying segment boundaries using a content-based technique (e.g., a function is calculated at various locations of a data item, when the function is equal to a value or when the value is a minimum, a maximum, or other extrema value relative to other function values calculated for the data item), a non-content-based technique (e.g., based on data item property—for example, byte length, title, creation date), or any other appropriate technique. In various embodiments, a segment is restricted to a minimum and/or maximum length, to a minimum or maximum number of segments per data item, or any other appropriate limitation. Data segmenter/data reassembler 910 further processes information to indicate the segment(s) mapping to the file, data stream, or data block so that the file, data stream, or data block can be reconstructed from the segment(s). In some embodiments, a list of fingerprints is used to indicate a mapping of segment(s) that are associated with a file, data stream, or data block. Mapping information is stored using mapping storage 916.

Segment compress/segment decompress 912 compresses the segment(s). The compression and decompression system is compatible with being able to store the segment(s) using a deduplication system—for example, there is a one to one correspondence between a given segment and the compressed version of the given segment so that it can be identified by using the compressed version of the given segment whether the given segment in its compressed form has been previously stored. In various embodiments, compression system and/or decompression system comprise(s) a lossless compression/decompression system, a Huffman coding system, a Lempel-Ziv Welch coding system, or any other appropriate system.

Segment encrypter/segment decrypter 912 encrypts the compressed segment(s). The encryption and decryption system is compatible with being able to store the compressed segment(s) using a deduplication system—for example, there is a one to one correspondence between a given compressed segment and the encrypted version of the given compressed segment so that it can be identified by using the encrypted version of the given compressed segment whether the given compressed segment in its encrypted form has been previously stored. Note that this somewhat degrades the strength of possible encryption systems that can be used, however the overall system performance of having an encrypted deduplication system outweighs for some applications the selection of encryption system with the required properties. In various embodiments, encryption system and/or decryption system comprise(s) a stream cipher (e.g., Rivest Cipher 4 (RC4), Rivest Cipher 5 (RC5), etc.), a cipher feedback system, electronic code book, advanced encryption standard (AES), data encryption standard (DES), or any other appropriate system. In some embodiments, a fixed block cipher system is used by padding a segment to a fixed block size before encrypting or depadding after decrypting.

The encrypted compressed segment is transferred to a system coupled to storage user system 900 via interface 922 and network 924.

User 928 is able to request via user interface 926 that a file, data stream, or data block is to be retrieved. Information stored in mapping storage 916 is used by data segmenter/data reassembler 910 to determine which encrypted compressed segment(s) to request to be retrieved from a deduplicating segment storage system (e.g., storage system 100 of FIG. 1). The encrypted compressed segment(s) are transferred via network 924 and interface 922 and decrypted using segment encrypter/segment decrypter 914. Segmenter encrypter/segment decrypter 914 uses information stored in key storage 920 to decrypt encrypted compressed segment(s). In various embodiments, keys stored in key storage 920 are associated with segments based at least in part on one or more of the following: a user, a source system, a session, or any other appropriate manner of assigning keys associated with a file, data stream, or data block. Segment compress/segment decompress 912 uses information stored in compression storage 918 to decompress decrypted compressed segment(s). In various embodiments, compression information stored in compression storage 918 are associated with segments based at least in part on one or more of the following: a user, a source system, a session, or any other appropriate manner of assigning compression information associated with a file, data stream, or data block. Data segmenter/data reassemble 910 reassembles the decompressed decrypted segment(s) to restore the file, data stream, or data block.

Figure 10:
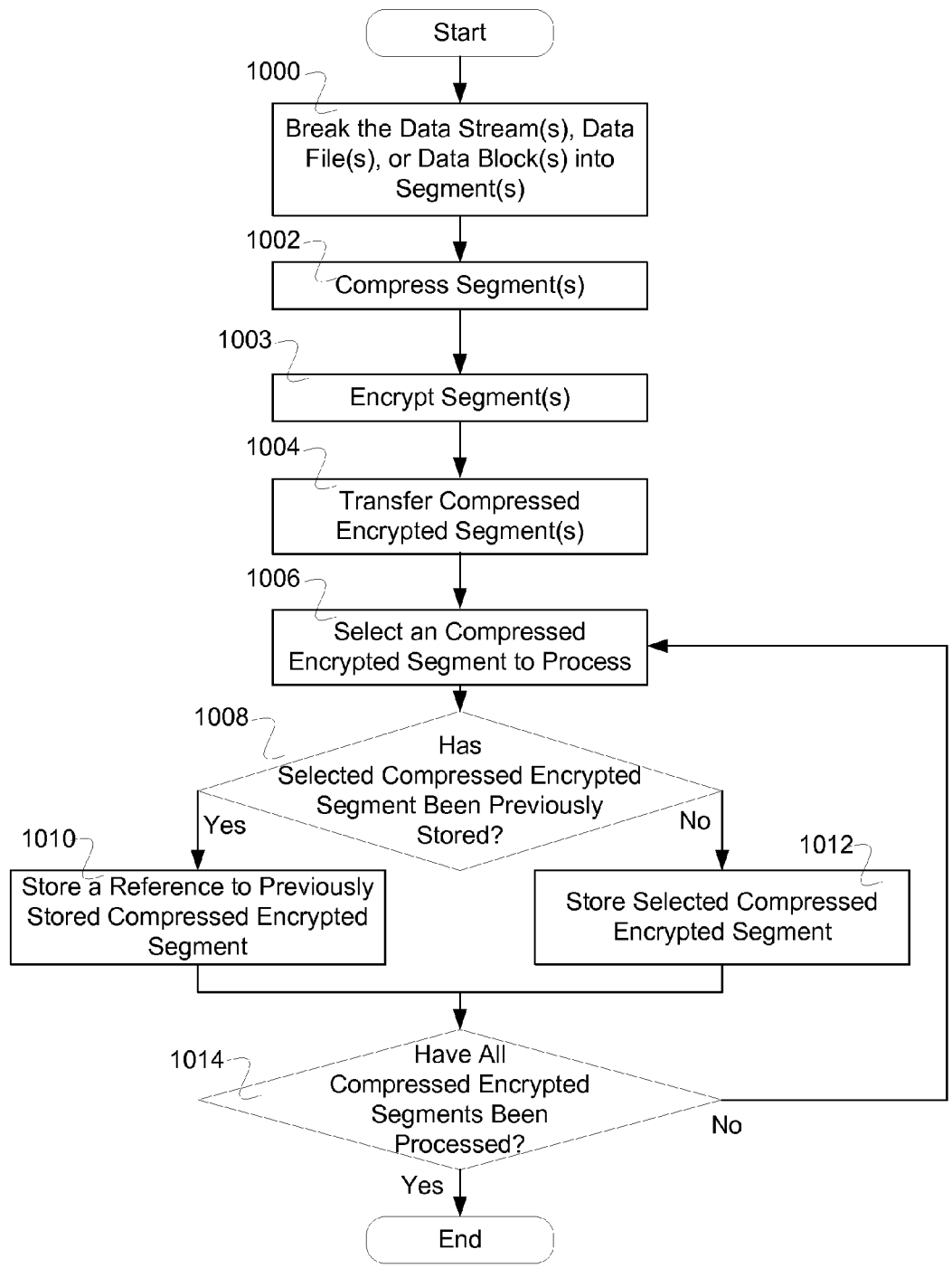
FIG. 10 is a flow diagram illustrating an embodiment of a process for storing data.

FIG. 10 is a flow diagram illustrating an embodiment of a process for storing data. In the example shown, in 1000 the data stream(s), data file(s), or data block(s) is/are broken into segment(s). In 1002, segment(s) are compressed. In 1003, segment(s) are encrypted. In 1004, compressed encrypted segment(s) is/are transferred. For example, the compressed encrypted segment(s) is/are transferred from a data user system to a storage system. In various embodiments, metadata information is transferred associated with the compressed encrypted segment(s)—for example, a segment identifier, a source identifier, a user identifier, a host identifier, a session identifier, a compression type, a compressor state, an encryption type, an encryption key, a format type, a pad type, an associated file, data stream, or data block, etc. In 1006, a compressed encrypted segment is selected to be processed. In 1008, it is determined whether the selected compressed encrypted segment has been previously stored.

In some embodiments, a check is performed before transferring the compressed encrypted segment to determine whether the encrypted segment has been previously stored and transfer of the full segment is only performed in the event that the compressed encrypted segment has not been previously stored.

In the event that the segment has been previously stored, in 1010 a reference is stored to the previously stored compressed encrypted segment, if appropriate. For example, a reference is stored in the event that the reference is useful in being able to retrieve the compressed encrypted segment with respect to retrieving the data stream(s), data block(s), or file(s) associated with the segment that has been compressed and encrypted and is determined to be identical to a previously stored compressed encrypted segment. In some embodiments, the reference is stored in an index that associates a mapping between data stream(s), data block(s), or file(s) and the segment(s) determined from the data stream(s), data block(s), or file(s). In some embodiments, a reference or indication is transferred to a user storage system.

In the event that the segment has not been previously stored, in 1012 the selected compressed encrypted segment is stored. An index entry is stored indicating the location at which the selected compressed encrypted segment is stored. In various embodiments, the index entry comprises digital fingerprint, a SHA-1 hash, Rabin Hash or any other appropriate identifier that is used to identify whether an identical segment has been previously stored. In some embodiments, the index entry is transferred to a user storage system.

In 1014, it is determined whether the all compressed encrypted segments have been processed. In the event that all the compressed encrypted segments have not all been processed, control passes to 1006. In the event that all the compressed encrypted segments have all been processed, the process ends.

Figure 11:
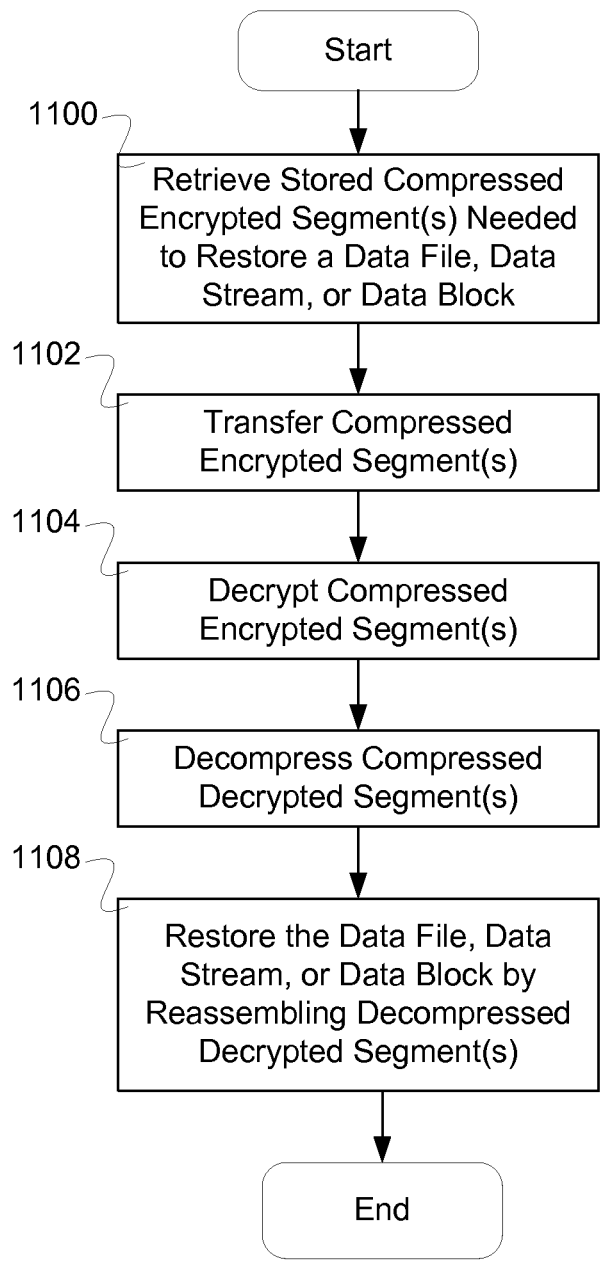
FIG. 11 is a flow diagram illustrating a process for retrieving data.

FIG. 11 is a flow diagram illustrating a process for retrieving data. In the example shown, in 1100 the stored compressed encrypted segment(s) needed to restore a data file, data stream, or data block are retrieved. In 1102, the compressed encrypted segment(s) are transferred. For example, the retrieved segment(s) are sent from a storage system to a storage user system. In 1104, the compressed encrypted segment(s) are decrypted. In 1106, the decrypted compressed encrypted segment(s) is/are decompressed. In 1108, the data file, data stream, or data block is restored by reassembling the decompressed decrypted segment(s).

Figure 12A:
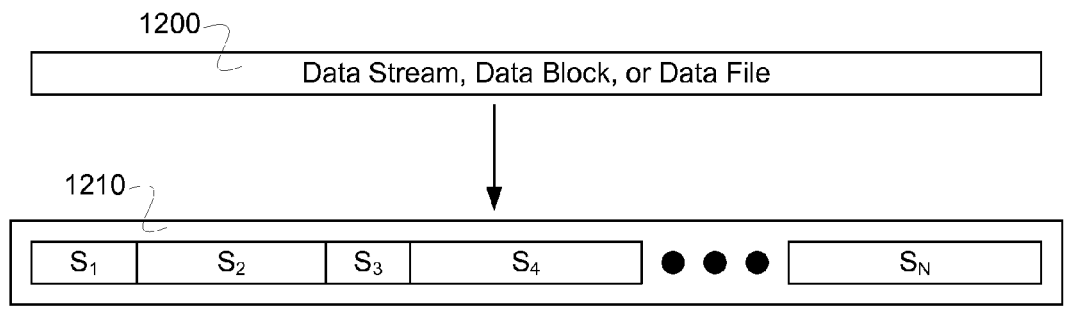
FIG. 12A is a block diagram illustrating an embodiment of data structures.

FIG. 12A is a block diagram illustrating an embodiment of data structures. In the example shown, data item 1200 comprises a data stream, data block, or data file. Data item 1200 is broken into set of segments 1210 of variable length. In some embodiments, the segments are of fixed length. Set of segments 1210 comprises one or more segments—represented in FIG. 12A by $S_1$, $S_2$, $S_3$, $S_4$, and $S_N$.

Figure 12B:
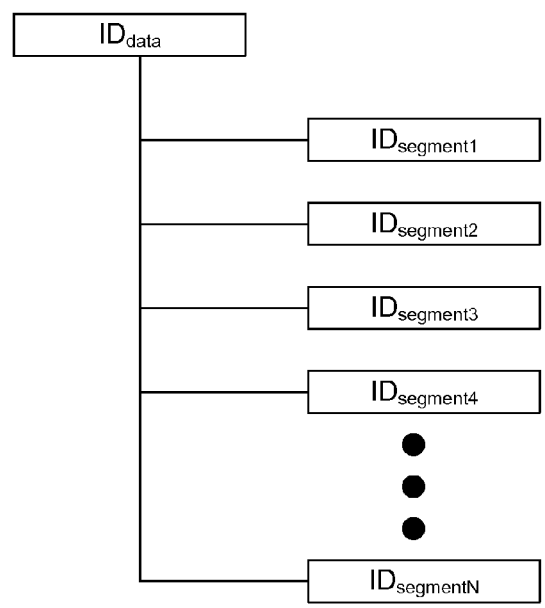
FIG. 12B is a block diagram illustrating an embodiment of data relations.

FIG. 12B is a block diagram illustrating an embodiment of data relations. In the example shown, a mapping between a data item ID and segment ID's is depicted—$ID_{data}$ is associated with $ID_{segment1}$, $ID_{segment2}$, $ID_{segment3}$, $ID_{segment4}$, up to $ID_{segmentN}$. The association relationship comprises that data of ID IDdata can be reconstructed or reassembled using a set of segments with ID's of, $ID_{segment2}$, $ID_{segment3}$, $ID_{segment4}$, up to $ID_{segmentN}$. In some embodiments, data relations of FIG. 12B are stored using mapping storage (e.g., mapping storage 316 of FIG. 3, mapping storage 616 of FIG. 6 and/or mapping storage 916 of FIG. 9).

Figure 13A:
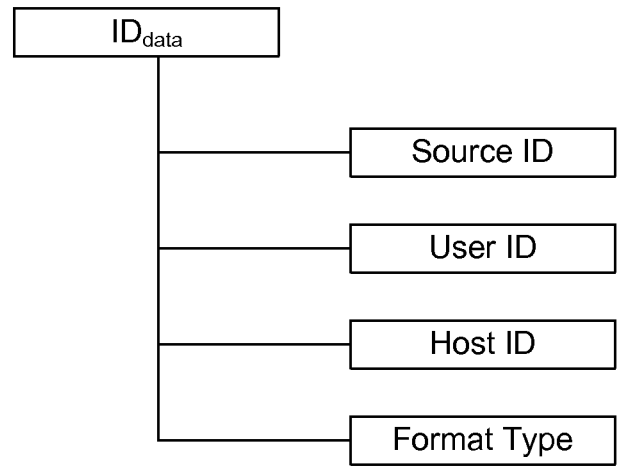
FIG. 13A is a block diagram illustrating an embodiment of data relations.

FIG. 13A is a block diagram illustrating an embodiment of data relations. In the example shown, a mapping between a data item ID and source ID, user ID, host ID, and format type is depicted. An ID for a data item is associated with a source of source ID (e.g., a system source identifier), a user with user ID (e.g., a user identifier that generated, requested to be stored, requested to be retrieved the data item), a host with host ID (e.g., a host system associated with a user), and a format of format type (e.g., stream, block, file, backup, raw, tape format, etc.). In various embodiments, any combination of ID's or lack of ID's or other appropriate associated information is mapped with data item ID. In some embodiments, data relations of FIG. 13A are stored using mapping storage (e.g., mapping storage 316 of FIG. 3, mapping storage 616 of FIG. 6 and/or mapping storage 916 of FIG. 9).

Figure 13B:
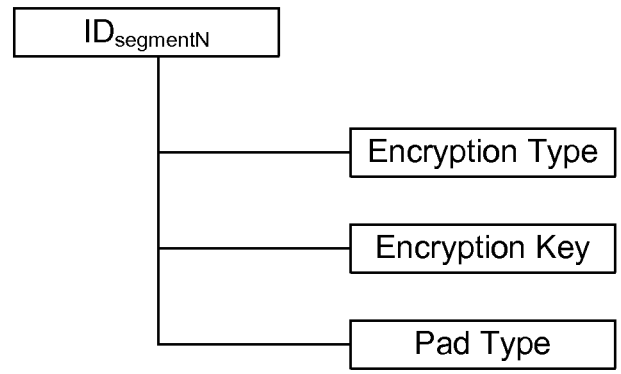
FIG. 13B is a block diagram illustrating an embodiment of data relations.

FIG. 13B is a block diagram illustrating an embodiment of data relations. In the example shown, a mapping between a segment ID and encryption type, encryption key, and pad type is depicted. An ID for a segment is associated with an encryption of encryption type (e.g., AES, DES, etc.), a key used for encrypting (e.g., a key comprising 128 bits, 256 bits, an alphanumeric string, etc.), and a padding of padding type (e.g., a type of padding added to a variable length segment to achieve a data length compatible with the encryption type, zero pads, data pattern pad, etc.). In various embodiments, any combination of encryption related information or other appropriate associated information is mapped with data segment ID. In some embodiments, data relations of FIG. 13B are stored using key storage (e.g., key storage 318 of FIG. 3 and/or key storage 920 of FIG. 9).

Figure 13C:
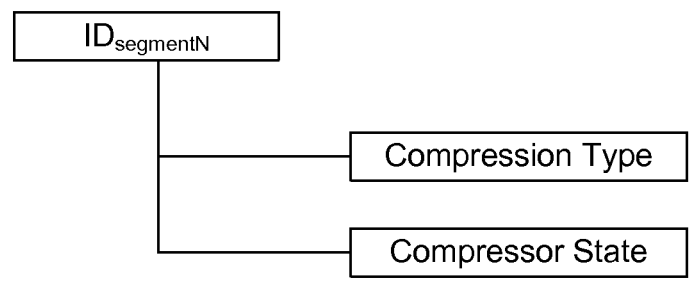
FIG. 13C is a block diagram illustrating an embodiment of data relations.

FIG. 13C is a block diagram illustrating an embodiment of data relations. In the example shown, a mapping between a segment ID and compression type and compressor state is depicted. An ID for a segment is associated with a compression of compression type (e.g., Huffman coding system, a Lempel-Ziv Welch coding system, etc.) and a state used for compressing (e.g., a key comprising 128 bits, 256 bits, an alphanumeric string, etc). In various embodiments, any combination of compression related information or other appropriate associated information is mapped with data segment ID. In some embodiments, data relations of FIG. 13C are stored using compression storage (e.g., compression storage 618 of FIG. 6 and/or compression storage 918 of FIG. 9).

Although the foregoing embodiments have been described in some detail for purposes of clarity of understanding, the invention is not limited to the details provided.

There are many alternative ways of implementing the invention. The disclosed embodiments are illustrative and not restrictive.

What is claimed is:

1. A system for reading compressed data, comprising:
 a deduplicated storage device;
 a processor configured to:
 receive a request for a data stream, a data block, or a data file to be retrieved;
 retrieve one or more compressed segments and corresponding metadata information for each compressed segment,
  wherein the corresponding metadata information comprises a compression type and a compression state from the deduplicated storage device using mapping information,
  wherein the compression state comprises a state used for compressing the compressed segment, wherein the compression state comprises a 128 bit key, a 256 bit key, or an alphanumeric key,
  wherein the one or more compressed segments were determined by breaking the data stream, the data block, or the data file into one or more segments and compressing each of the one or more segments,
  wherein the deduplicated storage device stores compressed segments that have not been previously stored and references to compressed segments that have been determined to be identical to a previously stored compressed segment,
  wherein the deduplicated storage device stores compressed segments that have not been previously stored with an index entry generated from the compressed segments,
  wherein the index entry comprises one or more of the following: a digital fingerprint, SHA-1 hash, or Rabin Hash of each unique compressed segment,
  wherein the deduplicated storage device further retrieves the one or more compressed segments indicated by the mapping information using index entries of compressed segments in the deduplicated storage;
 decompress the one or more compressed segments using the segment compression information retrieved from the deduplicated storage device,
  wherein the segment compression information comprises a segment identifier and a compression type; and
 assemble the one or more compressed segments to reconstruct the data stream, the data block, or the data file using the mapping information,
  wherein the mapping information comprises a mapping of segment identifiers and the data stream, the data block, or the data file; and
 a memory coupled to the processor and configured to provide the processor with instructions.

2. A system as in claim 1, wherein the breaking the data stream, the data block, or the data file is based at least in part on one of the following: a content-based technique or a non-content-based technique.

3. A system as in claim 1, wherein the one or more compressed segments were compressed and decompressed with one of the following: a lossless compression system, a Huffman coding system, or a Lempel-Ziv Welch coding system.

4. A system as in claim 1, wherein for a first compressed segment and a second compressed segment that is identical to the first compressed segment, a decompressed first compressed segment is identical to a decompressed second compressed segment.

5. A method for reading compressed data, comprising:
 receiving a request for a data stream, a data block, or a data file to be retrieved;
 retrieving one or more compressed segments and corresponding metadata information for each compressed segment,
  wherein the corresponding metadata information comprises a compression type and a compression state from a deduplicated storage device using mapping information,
  wherein the compression state comprises a state used for compressing the compressed segment, wherein the compression state comprises a 128 bit key, a 256 bit key, or an alphanumeric key,
  wherein the one or more compressed segments were determined by breaking the data stream, the data block, or the data file into one or more segments and compressing each of the one or more segments,
  wherein the deduplicated storage device stores compressed segments that have not been previously stored and references to compressed segments that have been determined to be identical to a previously stored compressed segment,
  wherein the deduplicated storage device stores compressed segments that have not been previously stored with an index entry generated from the compressed segments,
  wherein the index entry comprises one or more of the following: a digital fingerprint, SHA-1 hash, or Rabin Hash of each unique compressed segment,
  wherein the deduplicated storage device further retrieves the one or more compressed segments indicated by the mapping information using index entries of compressed segments in the deduplicated storage;
 decompressing, using a processor, the one or more compressed segments using the segment compression information retrieved from the deduplicated storage device,
  wherein the segment compression information comprises a segment identifier and a compression type; and
 assembling the one or more decompressed segments to reconstruct the data stream, the data block, or the data file using the mapping information,
  wherein the mapping information comprises a mapping of segment identifiers and the data stream, the data block, or the data file.

6. A method as in claim 5, wherein the breaking the data stream, the data block, or the data file is based at least in part on one of the following: a content-based technique or a non-content-based technique.

7. A method as in claim 5, wherein the one or more compressed segments were compressed and decompressed with one of the following: a lossless compression system, a Huffman coding system, or a Lempel-Ziv Welch coding system.

8. A method as in claim 5, wherein for a first compressed segment and a second compressed segment that is identical to the first compressed segment, a decompressed first compressed segment is identical to a decompressed second compressed segment.

9. A system as in claim 5, wherein the deduplicating storage device stores metadata information associated with the segment.

10. A system as in claim 9, wherein the metadata information comprises one or more of the following: the segment identifier, a source identifier, a user identifier, a host identifier, a session identifier, a format type, an associated file, an associated data stream, or an associated data block.

11. A system as in claim 5, wherein the processor is further configured to provide the data stream, the data block, or the data file to a user.

12. A computer program product for reading compressed data, the computer program product being embodied in a non-transitory computer readable storage medium and comprising computer instructions for:

receiving a request for a data stream, a data block, or a data file to be retrieved;

retrieving one or more compressed segments and corresponding metadata information for each compressed segment, wherein the corresponding metadata information comprises a compression type and a compression state from a deduplicated storage device using mapping information, wherein the compression state comprises a state used for compressing the compressed segment, wherein the compression state comprises a 128 bit key, a 256 bit key, or an alphanumeric key, wherein the one or more compressed segments were determined by breaking the data stream, the data block, or the data file into one or more segments and compressing each of the one or more segments, wherein the deduplicated storage device stores compressed segments that have not been previously stored and references to compressed segments that have been determined to be identical to a previously stored compressed segment, wherein the deduplicated storage device stores compressed segments that have not been previously stored with an index entry generated from the compressed segments, wherein the index entry comprises one or more of the following: a digital fingerprint, SHA-1 hash, or Rabin Hash of each unique compressed segment, wherein the deduplicated storage device further retrieves the one or more compressed segments indicated by the mapping information using index entries of compressed segments in the deduplicated storage;

decompressing, using a processor, the one or more compressed segments using the segment compression information retrieved from the deduplicated storage device, wherein the segment compression information comprises a segment identifier and a compression type; and assembling the one or more decompressed segments to reconstruct the data stream, the data block, or the data file using the mapping information, wherein the mapping information comprises a mapping of segment identifiers and the data stream, the data block, or the data file.

* * * * *